United States Patent
Yang et al.

(10) Patent No.: US 12,185,643 B2
(45) Date of Patent: Dec. 31, 2024

(54) HIGH CRITICAL TEMPERATURE METAL NITRIDE LAYER WITH OXIDE OR OXYNITRIDE SEED LAYER

(71) Applicant: Applied Materials, Inc., Santa Clara, CA (US)

(72) Inventors: Zihao Yang, Santa Clara, CA (US); Mingwei Zhu, San Jose, CA (US); Shriram Mangipudi, Santa Clara, CA (US); Mohammad Kamruzzaman Chowdhury, Phoenix, AZ (US); Shane Lavan, San Jose, CA (US); Zhebo Chen, San Jose, CA (US); Yong Cao, San Jose, CA (US); Nag B. Patibandla, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/177,096

(22) Filed: Mar. 1, 2023

(65) Prior Publication Data
US 2023/0345846 A1    Oct. 26, 2023

Related U.S. Application Data

(63) Continuation of application No. 17/178,187, filed on Feb. 17, 2021, now Pat. No. 11,600,761.

(60) Provisional application No. 62/980,079, filed on Feb. 21, 2020.

(51) Int. Cl.
| | |
|---|---|
| *H10N 60/85* | (2023.01) |
| *G02B 6/12* | (2006.01) |
| *H10N 60/12* | (2023.01) |

(52) U.S. Cl.
CPC .............. *H10N 60/85* (2023.02); *H10N 60/12* (2023.02); *G02B 6/12* (2013.01)

(58) Field of Classification Search
CPC ........ H10N 60/0241; H10N 60/20; G01J 1/42
See application file for complete search history.

(56) References Cited

U.S. PATENT DOCUMENTS

| | | |
|---|---|---|
| 4,589,001 A | 5/1986 | Sakai et al. |
| 4,844,989 A | 7/1989 | Murduck et al. |
| 5,477,061 A | 12/1995 | Morohashi |
| 10,256,392 B1 | 4/2019 | Brink et al. |
| 10,424,711 B2 | 9/2019 | Schoelkopft, III et al. |

(Continued)

FOREIGN PATENT DOCUMENTS

| | | |
|---|---|---|
| JP | S60-169175 | 9/1985 |
| JP | H01-307281 | 12/1989 |

(Continued)

OTHER PUBLICATIONS

Wang et al., "Superconducting properties and crystal structures of single-crystal niobium nitride thin films deposited at ambient substrate temperature," Journal of Applied Science, May 1996, 79(10):7837-7842.

(Continued)

*Primary Examiner* — Matthew L Reames
(74) *Attorney, Agent, or Firm* — Fish & Richardson P.C.

(57) ABSTRACT

A superconducting device includes a substrate, a metal oxide or metal oxynitride seed layer on the substrate, and a metal nitride superconductive layer disposed directly on the seed layer. The seed layer is an oxide or oxynitride of a first metal, and the superconductive layer is a nitride of a different second metal.

20 Claims, 7 Drawing Sheets

(56) References Cited

U.S. PATENT DOCUMENTS

| | | |
|---|---|---|
| 11,600,761 B2 | 3/2023 | Yang et al. |
| 2008/0050528 A1 | 2/2008 | McCleskey et al. |
| 2009/0312186 A1 | 12/2009 | Norem et al. |
| 2012/0049323 A1 | 3/2012 | Ng et al. |
| 2013/0084712 A1 | 4/2013 | Yuasa et al. |
| 2015/0340841 A1 | 11/2015 | Joseph |
| 2015/0372217 A1 | 12/2015 | Schoelkopf, III et al. |
| 2017/0148950 A1 | 5/2017 | Dechoux et al. |
| 2017/0203368 A1 | 7/2017 | Maderud et al. |
| 2019/0189816 A1 | 6/2019 | Najafi et al. |
| 2020/0035481 A1 | 1/2020 | Tapily |
| 2020/0036332 A1 | 1/2020 | Abdo |
| 2020/0227618 A1 | 7/2020 | Hamilton et al. |
| 2022/0013707 A1 | 1/2022 | Yang et al. |
| 2022/0013708 A1 | 1/2022 | Yang et al. |
| 2022/0052248 A1 | 2/2022 | Yang et al. |

FOREIGN PATENT DOCUMENTS

| | | |
|---|---|---|
| JP | H02-039475 | 2/1990 |
| JP | H10-41558 | 2/1998 |
| JP | 2003-158306 | 5/2003 |
| JP | 2008-112769 | 5/2008 |
| JP | 2016-509800 | 3/2016 |
| JP | 2016-213363 | 12/2016 |
| KR | 10-2020-0012804 | 2/2020 |

OTHER PUBLICATIONS

Adamyan et al., "Tunable Superconducting Microstrip Resonators", Applied Physics Letters, Apr. 25, 2016, 108(17):172601, 5 pages.

Extended European Search Report in European Appln. No. 21756913.6, dated Jan. 31, 2024, 11 pages.

Güth et al., "Preparation of Conductive Buffer Architectures Based on IBAD-TiN," IEEE Transactions on Applied Superconductivity, Jun. 1, 2009, 19(3):3447-3450.

Hühne et al., "Application of Textured IBAD-TiN Buffer Layers in Coated Conductor Architectures," Supercond. Sci. Technol., Dec. 9, 2009, 23(1):014010, 6 pages.

Mironov et al., "Charge Berezinskii-Kosterlitz-Thouless Transition in Superconducting NbTiN Films," Cond-mat.supr-con, Submitted on Jul. 31, 2017, arXiv:1707.09679, 9 pages.

Office Action in Japanese Appln. No. 2022-549647, dated Nov. 21, 2023, 9 pages (with English translation).

International Search Report and Written Opinion in International Appln. No. PCT/US2021/018414, dated Jun. 10, 2021, 7 pages.

Polakovic et al., "Room temperature deposition of superconducting niobium nitride films by ion beam assisted sputtering," APL Materials, Jul. 2018, 6(7):076107 Wang et al., "Superconducting properties and crystal structures of single-crystal niobium nitride thin films deposited at ambient substrate temperature," Journal of Applied Science, May 1996, 79(10):7837-7842.

Office Action in Taiwanese Appln. No. 110105713, dated Aug. 5, 2024, 10 pages (with English summary and search report).

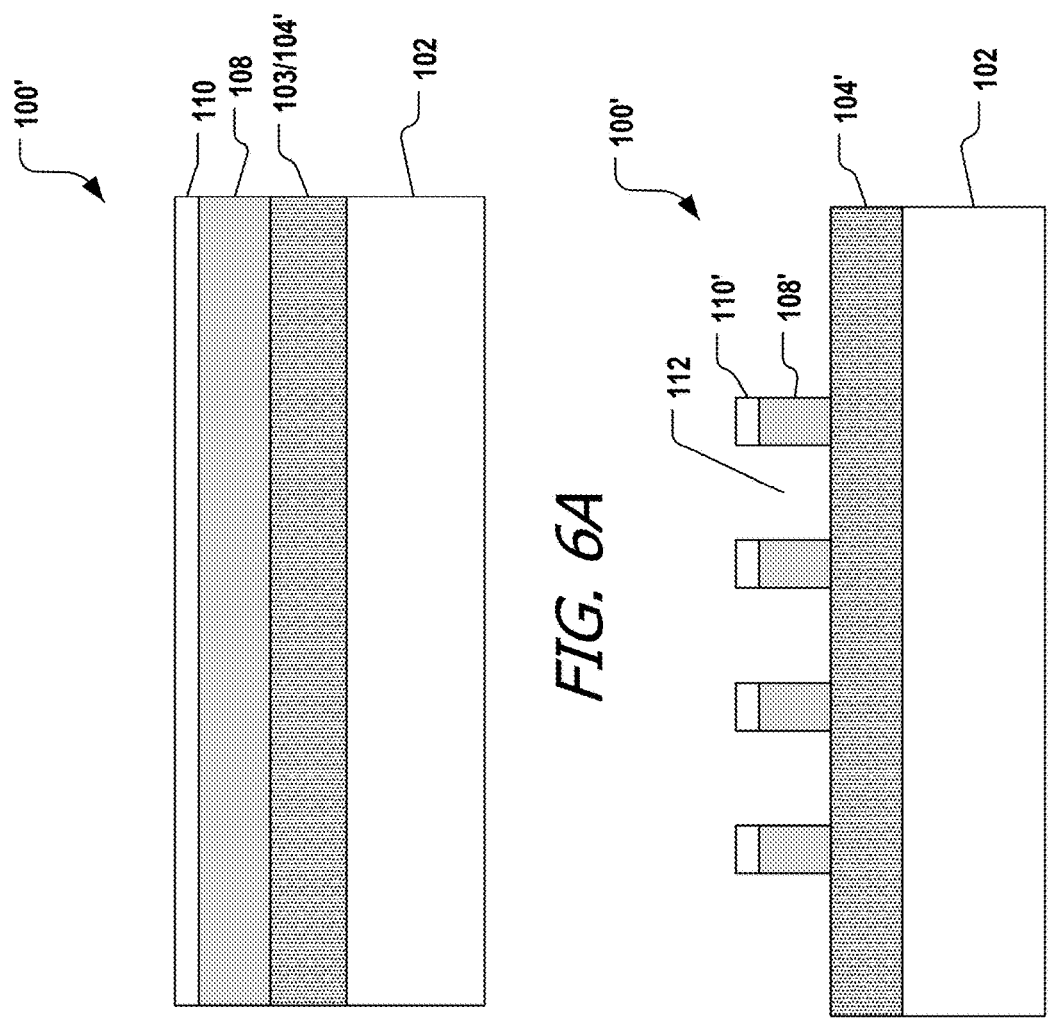
FIG. 6A
FIG. 6B
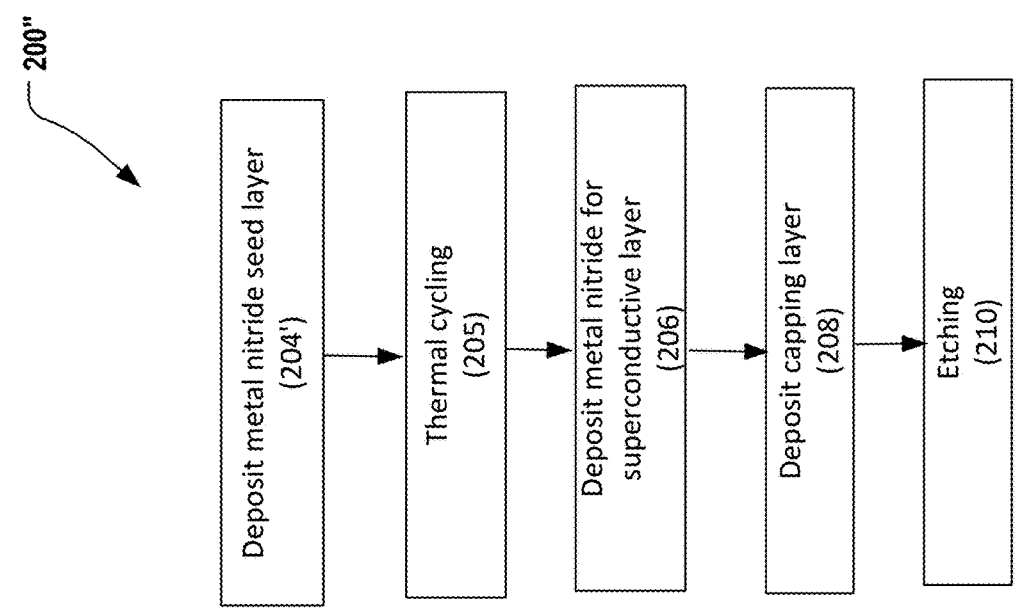
FIG. 7

HIGH CRITICAL TEMPERATURE METAL NITRIDE LAYER WITH OXIDE OR OXYNITRIDE SEED LAYER

CROSS-REFERENCE TO RELATED APPLICATIONS

This application is a continuation of U.S. application Ser. No. 17/178,187, filed on Feb. 17, 2021, which claims priority to U.S. Application Ser. No. 62/980,079, filed on Feb. 21, 2020, the disclosure of which is incorporated by reference.

BACKGROUND

Technical Field

The disclosure concerns use of a seed layer to improve the superconducting critical temperature of a metal nitride layer.

Background Discussion

In the context of superconductivity, the critical temperature (Tc) refers to the temperature below which a material becomes superconductive. Niobium nitride (NbN) is a material that can be used for superconducting applications, e.g., superconducting nanowire single photon detectors (SNSPD) for use in quantum information processing, defect analysis in CMOS, LIDAR, etc. The critical temperature of niobium nitride depends on the crystalline structure and atomic ratio of the material. For example, referring to FIG. 1, cubic δ-phase NbN has some advantages due to its relatively "high" critical temperature, e.g., 9.7-16.5 K (the indicated process temperatures are for a particular fabrication process, and not necessarily applicable other process and deposition chamber designs).

Niobium nitride can be deposited on a workpiece by physical vapor deposition (PVD). For example, a sputtering operation can be performed using a niobium target in the presence of nitrogen gas. The sputtering can be performed by inducing a plasma in the reactor chamber that contains the target and the workpiece.

SUMMARY

In one aspect, a superconducting device includes a substrate, a metal oxide or metal oxynitride seed layer on the substrate, and a metal nitride superconductive layer disposed directly on the seed layer. The seed layer is an oxide or oxynitride of a first metal, and the superconductive layer is a nitride of a different second metal.

In another aspect, a superconducting device includes a substrate, a lower seed layer on the substrate, an upper seed layer disposed directly on the lower seed layer, and a superconductive layer disposed directly on the upper seed layer. The lower seed layer is a nitride of a first metal, the upper seed layer is an oxide or oxynitride of the first metal, and the superconductive layer is a nitride of a different second metal.

Implementations may provide, but are not limited to, one or more of the following advantages. The critical temperature of the metal nitride layer, e.g., the NbN layer, can be increased. This permits fabrication of devices, e.g., SNSPDs, with superconductive wires with a higher critical temperature. The larger difference between the operating temperature (2-3 K) and the critical temperature provides superior detection efficiency, lower dark count, and possibly faster temporal response.

It should be noted that "superconductive" indicates that the material becomes superconducting at the operating temperature of the device, e.g., 2-3° K. The material is not actually superconducting during fabrication of the device at or above room temperature or when the device is not being cooled for operation.

The details of one or more implementations are set forth in the accompanying drawings and the description below. Other potential aspects, features, and advantages will become apparent from the description, the drawings, and the claims.

BRIEF DESCRIPTION OF THE DRAWINGS

FIG. 6A is a schematic cross-sectional view of a device that includes a metal nitride seed layer and a superconductive metal nitride layer.

FIG. 6B is a schematic cross-sectional view of the device of FIG. 6A in which the superconductive layer has been etched to form superconductive wires.

FIG. 7 is a flow chart of a method of fabricating the device of FIG. 6A or 6B.

Like reference numbers and designations in the various drawings indicate like elements.

DETAILED DESCRIPTION

As noted above, niobium nitride, particularly δ-phase NbN, has some advantages as a superconductive material. However, δ-phase NbN can be difficult to deposit at a satisfactory quality. Moreover, the larger difference between the operating temperature (2-3 K) and the critical temperature, the better the device performance. An aluminum nitride (AlN) layer can be used as a seed layer to improve the critical temperature of the NbN layer. Without being limited to any particular theory, the AlN seed layer may induce a crystalline structure in the NbN layer that provides an increased critical temperature.

However, it has been surprisingly discovered that exposure of the AlN seed layer to atmosphere and at room temperature before deposition of the NbN layer can actually provide a higher critical temperature, e.g., by about 0.5 K, than performing deposition of the NbN layer on the AlN seed layer without breaking vacuum and reducing the substrate temperature. Again, without being limited to any particular theory, two non-exclusive possibilities have been proposed. First, exposure of the AlN to atmosphere may result in the formation of a thin aluminum oxide or aluminum oxynitride layer on the surface of the AlN layer, which induces a superior crystalline structure in the NbN layer. Second, thermally cycling the AlN seed layer by reducing the temperature of the substrate from a first deposition temperature for the AlN, e.g., 400° C., to room temperature, i.e., 20-22° C., and then raising the temperature of the substrate back to a second deposition temperature for the NbN, e.g., 400° C., may affect stress in the AlN seed layer which may affect its crystalline structure, which in turn can affect the crystalline structure of the NbN layer.

Figure 1:
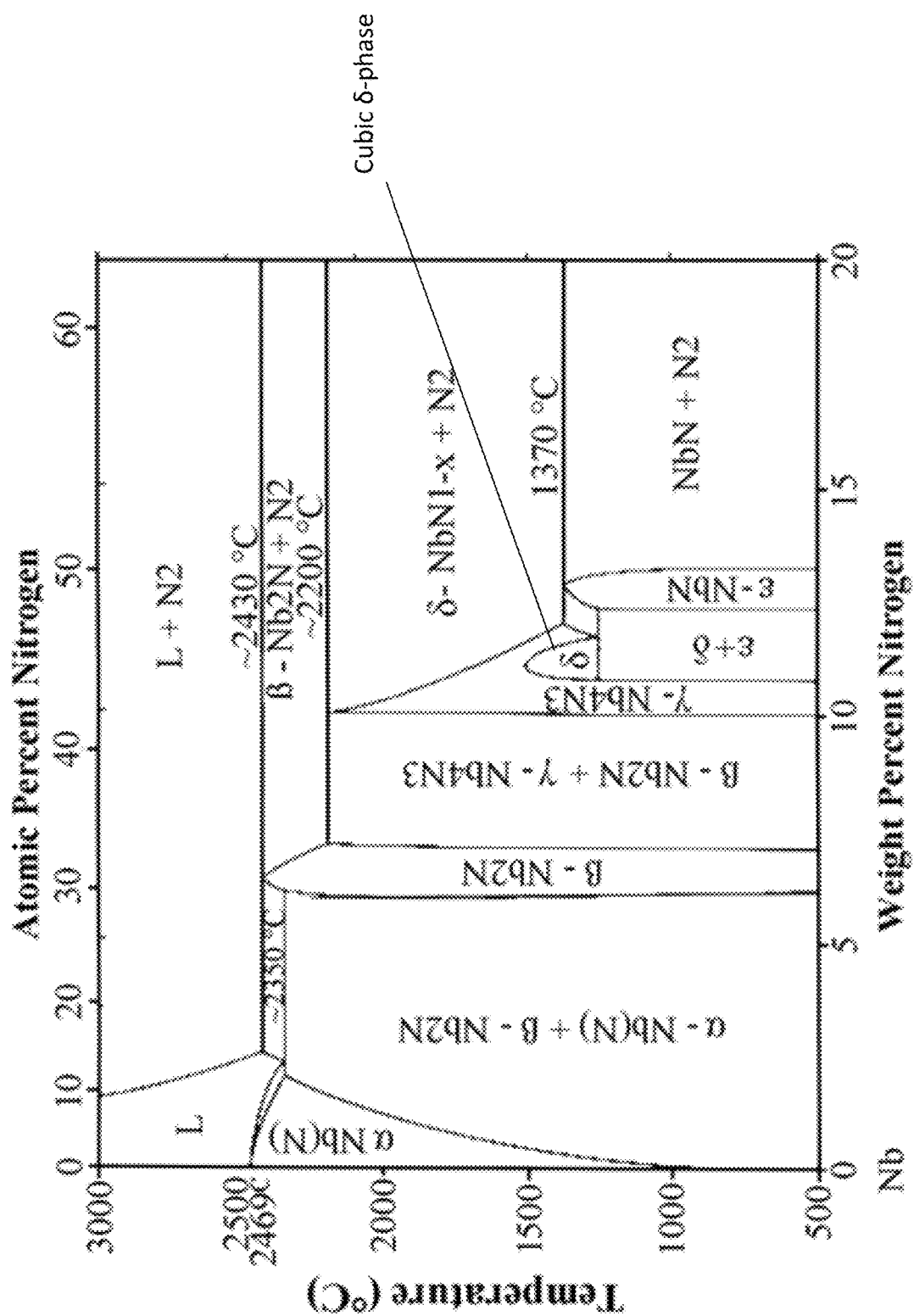
FIG. 1 diagram illustrating phase of niobium nitride as a function of processing temperature and atomic percentage nitrogen.
Figure 2A:
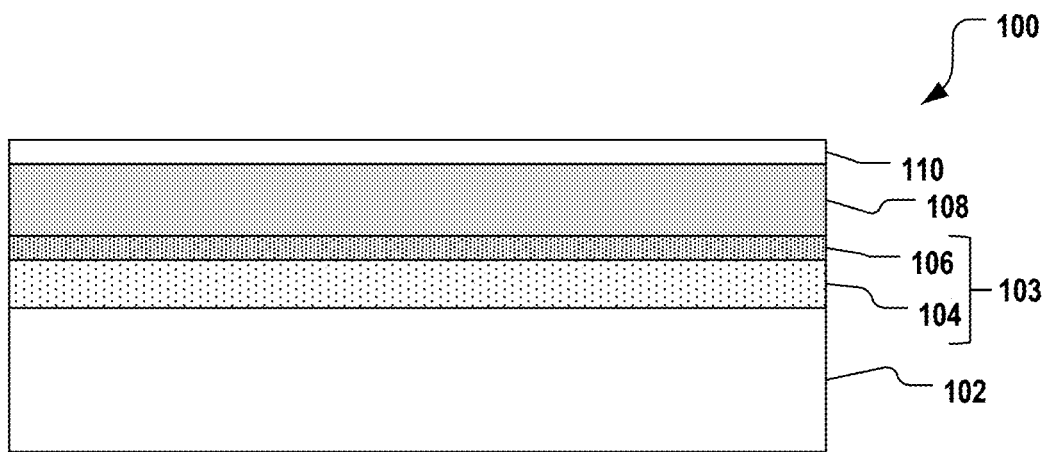
FIG. 2A is a schematic cross-sectional view of a device that includes a metal nitride lower seed layer, a metal oxide or oxynitride upper seed layer, and a superconductive metal nitride layer.
Figure 2B:
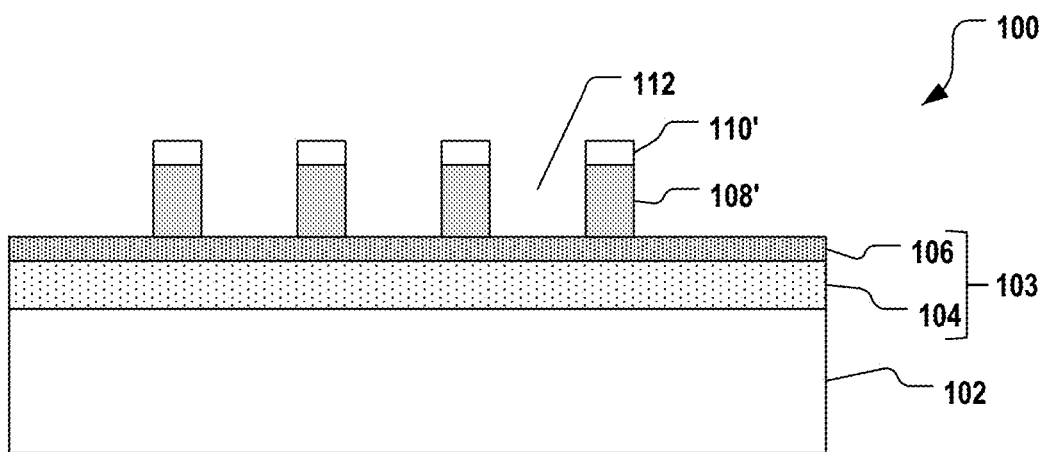
FIG. 2B is a schematic cross-sectional view of the device of FIG. 2A in which the superconductive layer has been etched to form superconductive wires.
Figures 3A, 3B, 3C:
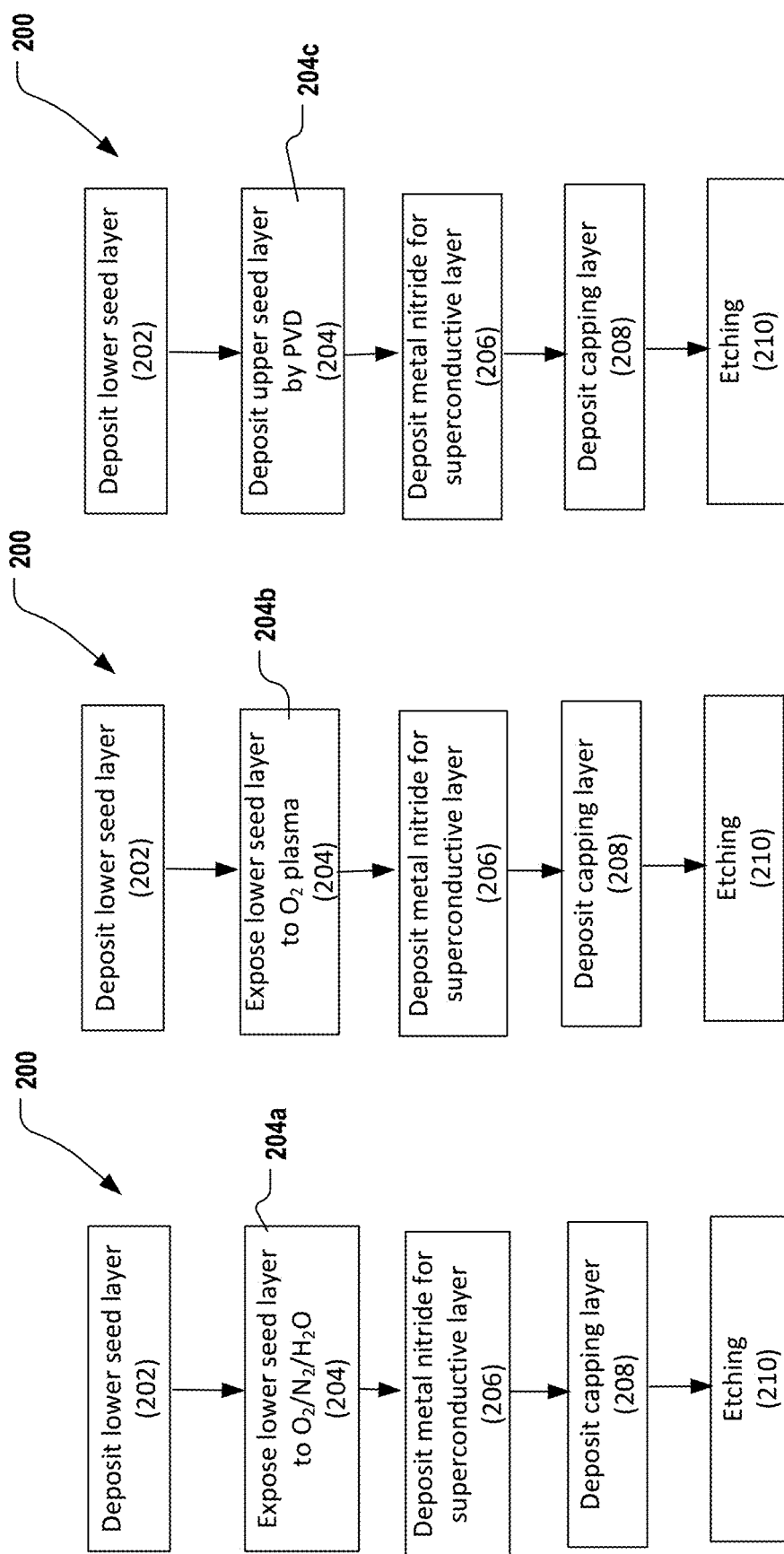
FIGS. 3A-3C are flow charts of a method of fabricating the device of FIG. 2A or 2B.

FIG. 2A is a schematic illustration of some layers in a device 100 that includes a metal nitride layer 108 for use as a superconductive material. FIG. 2B is a schematic illustration of a device 100 in which the metal nitride layer has been formed into features, e.g., superconductive wires 108'. The device 100 could be superconducting nanowire single photon detectors (SNSPD), a superconducting quantum interference device (SQUID), a circuit, e.g., an RF line, in a quantum computer, etc. FIGS. 3A-3C are flowcharts of methods 200 of fabrication.

The metal nitride layer 108 is disposed on a support structure 102. The support structure 102 can include a substrate, e.g., a silicon wafer. The substrate can be a dielectric material, e.g., sapphire, $SiO_2$, fused silica, or quartz, or a semiconductor material, e.g., silicon, gallium nitride (GaN) or gallium arsenide (GaAs). Although illustrated as a single block, the support structure 102 could include multiple underlying layers. For example, the support structure 102 can include a distributed Bragg reflector (DBR) that includes multiple pairs of layers formed of high refractive index and low refractive index materials deposited over the substrate, or a waveguide formed on the substrate.

A seed layer structure 103 is formed over the support structure 102. The seed layer structure 103 includes a lower layer seed layer 104 and an upper layer seed layer 106.

Covering the top of the support structure 102, e.g., in direct contact with the top surface of the support structure 102, is a lower layer seed layer 104. The lower seed layer 104 is a metal nitride layer. In particular, the lower seed layer 104 and the superconductive layer 108 are nitrides of different metals. The lower seed layer 104 can be aluminum nitride (AlN). However, hafnium nitride (HfN), chromium nitride (CrN), or nitride of an alloy of aluminum and either hafnium or scandium, might also be suitable.

The lower seed layer 104 can have a thickness of about 3 to 50 nm, e.g., about 5 nm or about 10 nm or about 20 nm thickness. The lower seed layer 104 can have a (002) c-axis crystal orientation. The lower seed layer 104 need not be superconducting at the operating temperature of the device 100. The lower seed layer 104 can be deposited (step 202) by a standard chemical vapor deposition or physical vapor deposition process. The deposition process can be conducted with the substrate at a temperature of 200-500° C., e.g., 400° C.

Exemplary processing parameters for the lower seed layer are a power applied to the sputtering target of 1-5 kW, a total pressure (nitrogen and inert gas) of 2 to 20 mTorr with nitrogen gas and inert gas supplied at a ratio between 3:100 and 6:1, e.g., about 3:1, a wafer temperature of 200-500° C., and no bias voltage applied to the wafer.

Formed on top of the lower seed layer 104, e.g., in direct contact with the top surface of the lower seed layer 104, is an upper seed layer 106 (step 204). The upper seed layer 106 is a metal oxide or metal oxynitride layer. In particular, the upper seed layer 106 is an oxide or oxynitride of the same metal as the metal of the metal nitride in the lower seed layer 104. The upper seed layer 106 can be aluminum oxide or aluminum oxynitride, as this appears to improve the critical temperature of NbN, e.g., by about 0.5 K over aluminum nitride as a seed layer. However, hafnium oxide or oxynitride, chromium oxide or oxynitride, or an oxide or oxynitride of an alloy of aluminum and either hafnium or scandium, might also be suitable.

The upper seed layer 106 can be thinner than the lower seed layer 104. The upper seed layer 106 can be about 0.1-3 nm thick, depending on the method of fabrication. In some implementations, the upper seed layer 106 is only one to five atomic layers thick, e.g., two or three atomic layers thick. The upper seed layer 106 can have a (002) c-axis crystal orientation. The upper seed layer 106 need not be superconducting at the operating temperature of the device 100.

Referring to FIG. 3A, one technique that can be used to form the metal oxide or metal oxynitride of the upper seed layer 106 is to expose the lower seed layer 104 to a gas containing oxygen and/or water (step 204a). For example, the lower seed layer 104 can be exposed to air. As another example, the lower seed layer 104 could be exposed to pure oxygen. As another example, the lower seed layer 104 could be exposed to a gas mixture containing oxygen at 20-90% by volume and one or more other gases, such nitrogen and/or a noble gas, e.g., argon. In some implementations, the gas mixture includes water, e.g., water vapor or steam. The pressure can be 1 Torr to 1 atmosphere, e.g., 0.8 to 1 atmosphere.

Referring to FIG. 3B, another technique that can be used to form the metal oxide or metal oxynitride of the upper seed layer 106 is to expose the lower seed layer 104 to a gas containing oxygen ($O_2$) plasma (step 204b). For example, the lower seed layer 104 could be exposed to pure oxygen plasma. For example, oxygen gas can be directed into a plasma processing chamber, and an oxygen plasma can be formed at a power of about 100 W. The pressure can be 2 to 500 mTorr. In general, a dedicated chamber for oxygen plasma treatment can use a relatively higher pressure, e.g., 100-500 mTorr, whereas a relatively lower pressure, e.g., 2 to 15 mTorr, can be used if the oxygen plasma treatment is performed in the same chamber that is used for the deposition of the lower seed layer.

Without being limited to any particular theory, exposure of AlN to oxygen may result in the formation of a thermal oxide or thermal oxynitride layer, i.e., an aluminum oxide or aluminum oxynitride layer, on the surface of the AlN layer.

In some implementations, the substrate with the lower seed layer is lowered from a first temperature at which the lower seed layer is deposited, e.g., 300-500° C., to a lower second temperature, e.g., 20-300° C. The lower seed layer is exposed to the oxygen-containing gas or plasma at the lower second temperature. The second temperature can be at least 200° C. lower than the first temperature. For example, the second temperature can be room temperature, i.e., 20-22° C. The substrate is then raised to an elevated third temperature for deposition of the metal nitride of the superconductive layer.

In some implementations, the substrate with the lower seed layer is maintained at an elevated temperature, e.g., at or above 300° C., e.g., at the same temperature at which the lower seed layer is deposited, e.g., 400° C., and the substrate is exposed to the oxygen-containing gas or plasma at the elevated temperature.

In some implementations, the substrate with the lower seed layer is lowered from the first temperature to the second temperature, then raised up to elevated third temperature, e.g., at or above 300° C., e.g., 300-500° C., and the lower seed layer exposed to the oxygen-containing gas or plasma, at the elevated third temperature.

The exposure time can depend on pressure and temperature, and can be from 1 second to 120 minutes. For example, the exposure time for atmosphere at room temperature can be about 45 minutes. As another example, the exposure time for oxygen plasma with the substrate at the same temperature at which the lower seed layer is deposited, e.g., at about 400° C., can be about 30 seconds.

In the techniques of FIGS. 3A and 3B, the upper seed layer 106 is effectively a native oxide or native oxynitride formed on the underlying metal nitride layer, and thus expected to be two to four atomic layers thick. For example, the upper seed layer 106 can be up to about 1 nm thick.

Referring to FIG. 3C, another technique that can be used to form the metal oxide or metal oxynitride of the upper seed layer 106 is to deposit the upper seed layer 106 by physical vapor deposition. Exemplary processing parameters for the upper seed layer are a power applied to the sputtering target of 1-5 kW, a total pressure (oxygen and inert gas) of 2 to 20 mTorr with oxygen gas and inert gas supplied at a ratio between 3:100 and 6:1, and a wafer temperature of 200-500° C. There are also CVD and ALD techniques to deposit aluminum oxide or oxynitride.

In the technique of FIG. 3C, the thickness of the upper seed layer 106 depends on the processing time or number of iterations of the deposition process. For example, the thickness of the upper seed layer 106 can be 1-2 nm.

Returning to FIGS. 2A and 2B, the superconductive metal nitride layer 108 is deposited (step 206) on, e.g., in direct contact with, the upper seed layer 106. The metal nitride layer 108 is formed of niobium nitride (NbN), titanium nitride (TiN), or niobium titanium nitride ($Nb_xTi_{1-x}N$). The superconductive layer 108 can have a thickness of 4 to 50 nm, e.g., about 5 nm or about 10 nm or about 20 nm.

The metal nitride layer 108 can be deposited using a standard chemical vapor deposition or physical vapor deposition process. Exemplary processing parameters are a base pressure of 1e-8 Torr, a power applied to the target of 1-3 kW, a total pressure during processing of 5-7 mTorr, a wafer temperature of 400° C., no bias voltage applied to the wafer, and a percentage of the gas as $N_2$ sufficient to achieve cubic δ-phase NbN. In some implementations, the metal nitride layer 108 is deposited in the same processing chamber that is used to deposit the lower seed layer 104 and upper seed layer 106, e.g., by switching in a new target. This permits higher throughput manufacturing. Alternatively, the substrate can be transported to a different deposition chamber without breaking vacuum. This permits the metal nitride layer to be deposited without exposure of the seed layer to atmosphere and with lower risk of contamination.

After the metal nitride layer 108 is deposited, a capping layer 110 can be deposited on the metal nitride layer 108 (step 208). The capping layer 110 serves as a protective layer, e.g., to prevent oxidation of the metal nitride layer 108 or other types of contamination or damage. The capping layer 108 can be dielectric but need not be superconductive at the operating temperature of the device 100. The capping layer 108 can be amorphous silicon (a-Si). In some implementations, the capping layer 108 is a nitride of a different material from the metal of the metal nitride used for the superconductive layer 108. Examples of materials for the capping layer 108 include AlN, $Al_2O_3$, $SiO_2$, and SiN. The capping layer 108 can be deposited by a standard chemical vapor deposition or physical vapor deposition process.

Etching can be used to form trenches 112 through at least the metal nitride layer 108 to form the superconductive wires 108' or other structures needed for the device 100 (step 210). The wires 108' can have a width of about 25 to 250 nm, e.g., about 60 nm. Although FIG. 2B illustrates the trenches 112 as extending through the metal nitride layer 108 and capping layer 110 and not into the upper seed layer 106, other configurations are possible. As an example, the trenches 112 can extend partially into or entirely through the upper seed layer 106, or entirely through the upper seed layer 106 and partially into or entirely through the lower seed layer 104.

Air can contain contaminants, so for any of the above processes, the upper seed layer 106 can be formed on the lower seed layer 104 without breaking vacuum, e.g., without removing the substrate from the deposition chamber in which the lower seed layer is deposited, or without breaking vacuum during transfer of the substrate from the deposition chamber in which the lower seed layer is deposited to the chamber in which the upper seed layer is formed. Similarly, the metal nitride superconductive layer 108 can be formed on the upper seed layer 106 without breaking vacuum.

Where the upper seed layer 106 is formed by oxygen plasma treatment (see FIG. 3B) or by PVD (see FIG. 3C), an Applied Materials Endura® with Impulse PVD could be used. The deposition of the lower seeding layer and either oxygen plasma treatment or PVD of an oxide or oxynitride could be performed within the same chamber. NbN deposition can be performed in a different chamber in the same Endura tool, but without breaking vacuum.

Figure 5:
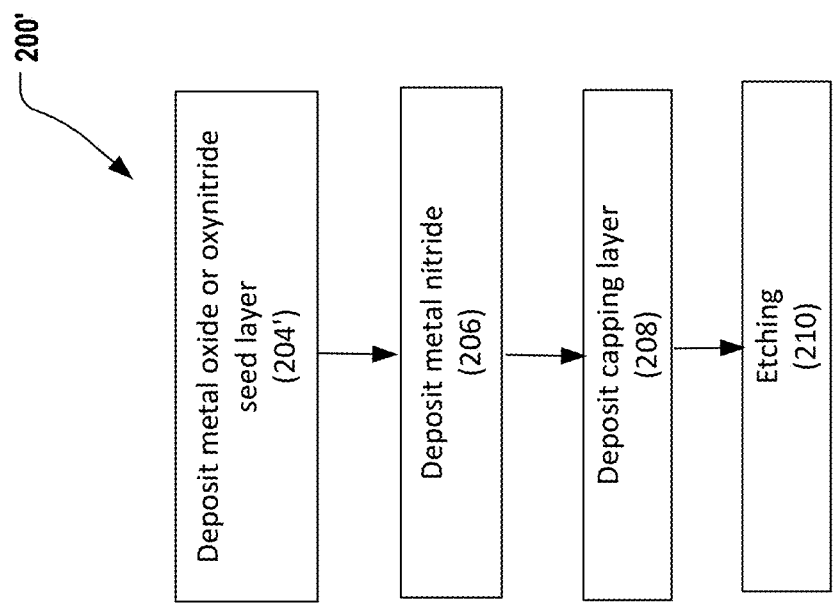
FIG. 5 is a flow chart of a method of fabricating the device of FIG. 4A or 4B.
Figure 4A:
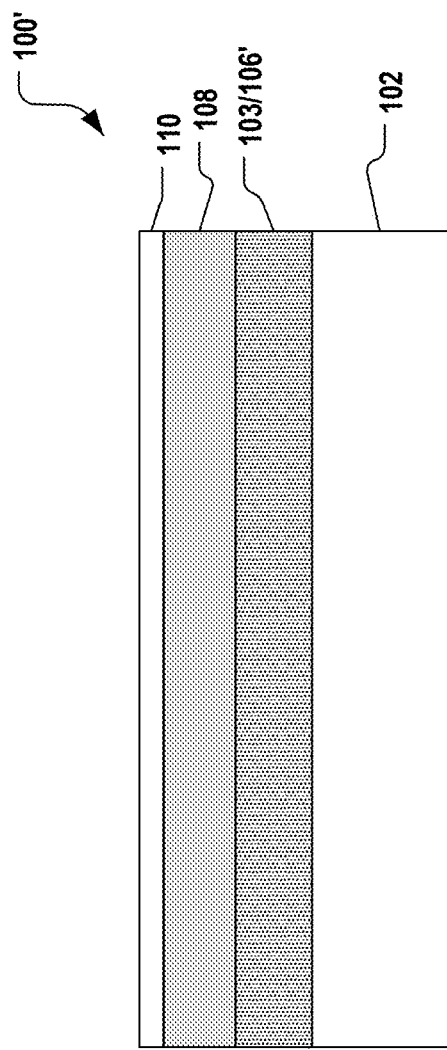
FIG. 4A is a schematic cross-sectional view of a device that includes a metal oxide or oxynitride seed layer and a superconductive metal nitride layer.
Figure 4B:
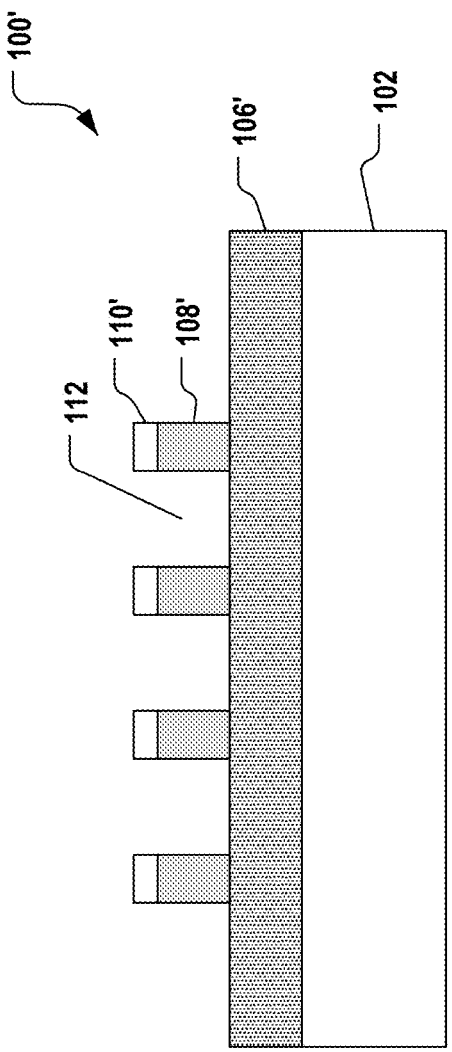
FIG. 4B is a schematic cross-sectional view of the device of FIG. 4A in which the superconductive layer has been etched to form superconductive wires.

FIG. 4A is a schematic illustration of some layers in a device 100' that includes a metal nitride layer 108 for use as a superconductive material. FIG. 4B is a schematic illustration of a device 100' in which the metal nitride layer has been formed into features, e.g., superconductive wires 108'. The device 100' is similar to the device 100, but instead of having both a lower seed layer and an upper seed layer, the seed layer structure 103 of device 100' has a single metal oxide or metal oxynitride seed layer 106'. Except as discussed below, the device 100' can be configured and manufactured as discussed with respect to device 100. FIG. 5 is a flowchart of a method 200' of fabrication.

A seed layer 106' is disposed on top of the support structure 102. The seed layer 106' is a metal oxide or metal oxynitride. In particular, the seed layer 106' is an oxide or oxynitride of a different metal than the metal of the metal nitride in the superconductive layer 108. The seed layer 106' can be aluminum oxide or aluminum oxynitride (AlN), as this appears to improve the critical temperature of NbN, e.g., by about 0.5 K over aluminum nitride as a seed layer. However, hafnium oxide, hafnium oxynitride, gallium oxide, or gallium oxynitride might also be suitable. Unlike the device 100, there is no metal nitride layer of the same metal in direct contact with the bottom of the metal oxide or oxynitride seed layer 106'.

The seed layer 106' can have a thickness of about 3 to 50 nm, e.g., about 5 nm or about 10 nm or about 20 nm thickness. The seed layer 106' can have a (002) c-axis crystal orientation. The seed layer 106' need not be superconducting at the operating temperature of the device 100'. The seed layer 106' can be deposited (step 204') by a standard chemical vapor deposition or physical vapor deposition process. The deposition process can be conducted with the substrate at a temperature of 200-500° C., e.g., 400° C.

Exemplary processing parameters are a power applied to the sputtering target of 1-5 kW, a total pressure (nitrogen and inert gas) of 2 to 20 mTorr with nitrogen gas and inert gas supplied at a ratio between 3:100 and 1:6, a wafer temperature of 200-500° C., and no bias voltage applied to the wafer.

An Applied Materials Endura® with Impulse PVD could be used for deposition of the seed layer and the superconductive layer. For example, deposition of aluminum oxide can be performed in a first chamber, and NbN deposition can be performed in a different chamber in the same tool, but without breaking vacuum.

Thermal cycling can be applied between the deposition of the seed layer 106' and the superconductive layer 108. For example, the substrate with the seed layer 106' is lowered from the first temperature to the second temperature, then raised up to elevated third temperature, e.g., at or above 300° C., e.g., 300-500° C., for deposition of the metal nitride superconductive layer 108. Alternatively, the substrate with the seed layer 106' can be maintained at an elevated temperature, e.g., at or above 300° C., e.g., at the same temperature at which the seed layer 106' is deposited, e.g., 400° C., until deposition of the metal nitride superconductive layer 108.

FIG. 6A is a schematic illustration of some layers in a device 100" that includes a metal nitride layer 108 for use as a superconductive material. FIG. 6B is a schematic illustration of a device 100" in which the metal nitride layer has been formed into features, e.g., superconductive wires 108'. The device 100" is similar to the device 100', but instead of having a seed layer of metal oxide or metal oxynitride, the seed layer structure 103 of device 100" includes a single layer of metal nitride that has been subjected to thermal cycling. Except as discussed below, the device 100 can be configured and manufactured as discussed with respect to devices 100 and 100'. FIG. 7 is a flowchart of a method 200" of fabrication.

A seed layer 104' is disposed on top of the support structure 102. The seed layer 104' is a metal nitride. In particular, the seed layer 104' and the superconductive layer 108 are nitrides of different metals. The seed layer 104' can be aluminum nitride. However, hafnium nitride or gallium nitride might also be suitable. Unlike the device 100, there is no metal oxide or metal oxynitride between the seed layer 104' and the superconductive layer 108.

The seed layer 104' can be deposited (step 204') directly on the support structure 102 by a standard chemical vapor deposition or physical vapor deposition process. The deposition process can be conducted with the substrate at a first temperature of 200-500° C., e.g., 400° C.

After deposition, the substrate with the metal nitride seed layer is subjected to thermal cycling (step 205). In particular, the substrate with the seed layer is lowered from the first temperature at which the seed layer is deposited, e.g., 200-500° C., to a lower second temperature. For example, the substrate with the seed layer 104' is lowered from the first temperature at which the seed layer is deposited, e.g., 300-500° C., to a lower second temperature, e.g., 20-300° C. The second temperature can be at least 200° C. lower than the first temperature. For example, the second temperature can be room temperature, i.e., 20-22° C. The seed layer can be subject to thermal cycling while in vacuum, or while exposed to nitrogen and/or an inert gas, e.g., argon. The substrate is then raised to an elevated third temperature, e.g., e.g., 300-500° C., for deposition of the metal nitride of the superconductive layer. Thermally cycling may change the crystalline structure of the seed layer 104'.

After the thermal cycling, the metal nitride of the superconductive layer 108 can be deposited on the seed layer 104'. The superconductive layer 108 is deposited without breaking vacuum or otherwise exposing the seed layer to oxygen or an oxygen-containing vapor, e.g., $H_2O$.

Figure 8A:
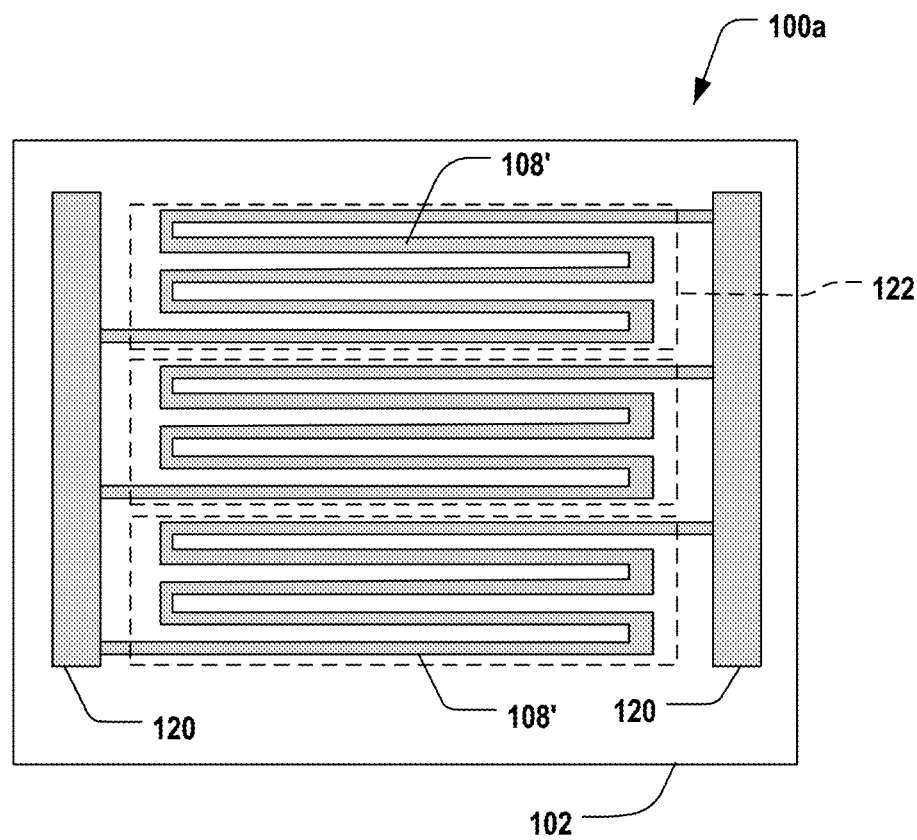
FIG. 8A is a schematic top view of a SNSPD that includes a distributed Bragg reflector.
Figure 8B:
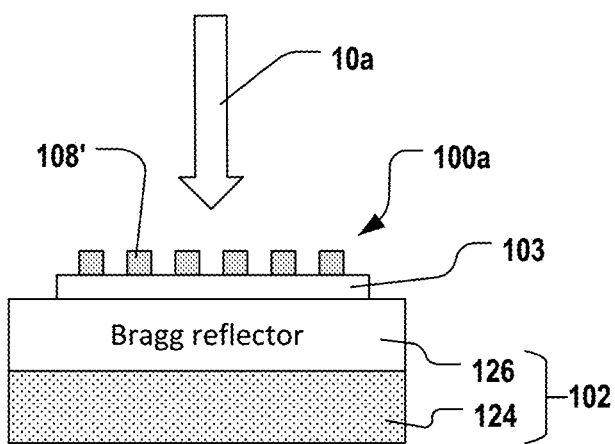
FIG. 8B is a schematic cross-sectional side view of the device of FIG. 8A.

FIGS. 8A and 8B illustrate top and side views, respectively, of a device 100a configured as a superconducting nanowire single photon detector (SNSPD). The device 100a can use any configuration of the seed layer 103 discussed above.

The SNSPD device 100a can include at least one superconductive wire 108' disposed on a support structure 102. The superconductive wire 108' can be connected between conductive electrodes 120. The superconductive wire 108' can be arranged in a meandering pattern, e.g., a back-and-forth parallel lines, on the supporting structure 102. In some implementations, multiple wires 108' are connected in parallel between the electrodes 120, with each wire 108' covering a separate area 152, but there could be just a single wire 108' covering the entire detection area of the device 100a. In addition, many other patterns are possible, e.g., zigzag or double spiral.

The support structure 102 includes a substrate 124 and a distributed Bragg reflector (DBR) 126 that includes multiple pairs of layers formed of high refractive index and low refractive index materials.

The SNSPD device 100a is operated with a photon (illustrated by light beam 10a) approaching from the top of the device 100a, e.g., with normal incidence relative to the substrate 124. The working principle of the SNSPD device is that the to-be-detected photon comes from top and shines on the SNPSD. Absorption of the photon, either on initial impingement or upon reflection from the DBR, creates a hot spot on the NbN nanowire which raises the temperature of the NbN above critical temperature so that a portion of the wire is no longer in the superconductive state. A region around the hot spot can experience current crowding, resulting in a higher current density than the critical current density, which can disrupt the superconductive state for the entire wire. The change in the NbN wire from the superconducting state to the normal resistive state can be electrically detected by flowing a current through the device and monitoring voltage differences between the electrodes.

Figure 9A:
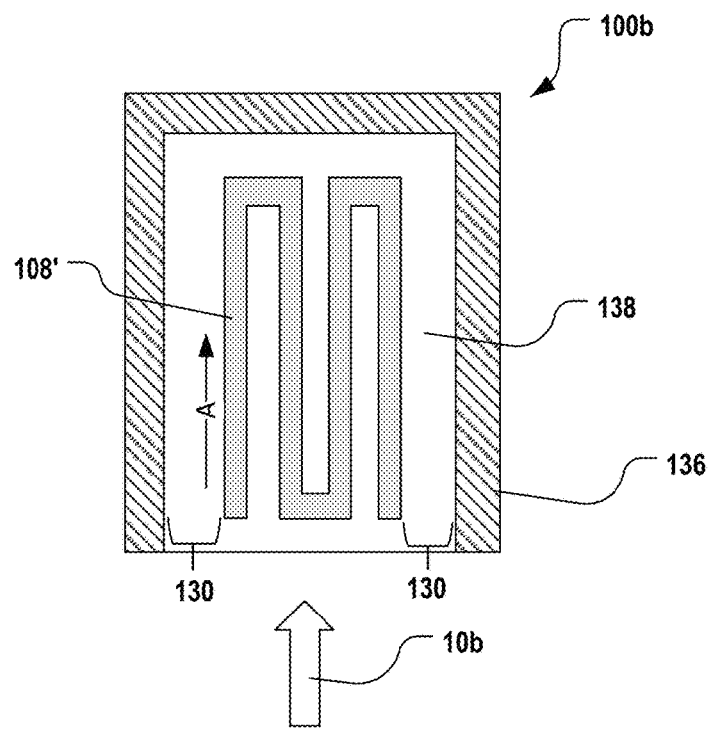
FIG. 9A is a schematic top view of a SNSPD that includes a waveguide.
Figure 9B:
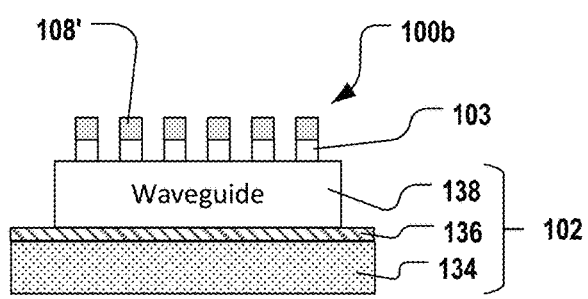
FIG. 9B is a schematic cross-sectional side view of the device of FIG. 9A.

Another form of superconducting nanowire single photon detector (SNSPD) device includes a waveguide to input photons into the detector along an axis generally parallel to the surface of the substrate. FIGS. 9A and 9B illustrate a device 100b configured as a superconducting nanowire single photon detector (SNSPD) and having a waveguide 138. The device 100b can use any configuration of the seed layer 103 discussed above.

The SNSPD device 100b can include at least one superconductive wire 108' disposed on a support structure 102. The superconductive wire(s) 108' can be arranged to form a plurality of parallel lines, with adjacent lines connected at alternating ends. Although FIG. 9A illustrates four parallel lines, the device could have just two parallel lines, e.g., a U-shaped wire, or a greater number of lines. The superconductive wire 108' can be connected between conductive electrodes.

The support structure 102 can include a substrate 134, a dielectric layer 136 on the substrate 134, and a waveguide 138 disposed on the dielectric layer 136. The dielectric layer 102c is a first material having a first refractive index, and the waveguide 102d is a second material having a second refractive index that is higher than the first refractive index.

Photons, shown by light beam 10b, are injected into the device from the side, e.g., generally parallel to the top surface of the substrate 132, through the waveguide 138. In particular, the photons can enter along an axis (shown by arrow A) generally parallel to the parallel lines of the wire 108'.

In addition, along the axis transverse to the direction of light propagation, the wire 108' can be located near the center of the waveguide 138. For example, on each side of device, there can be a gap 130 between the outer edge of the wire 108' and the outer edge of the waveguide 138. This gap 130 can have a width of about 25-30% of the total width of the waveguide.

In general, because the dielectric layer 136 below the waveguide 138 and the empty space or air above the waveguide 138 both have a lower refractive index than the waveguide 138, the photons in the waveguide 138 are trapped by total internal reflection. However, due to the optical coupling between the waveguide 138 and the nanowire 108', the photons can escape into the nanowire 108' and thus be absorbed by the nanowire 108'. The light coupling efficiency can be very high in this type of device.

Figure 9C:
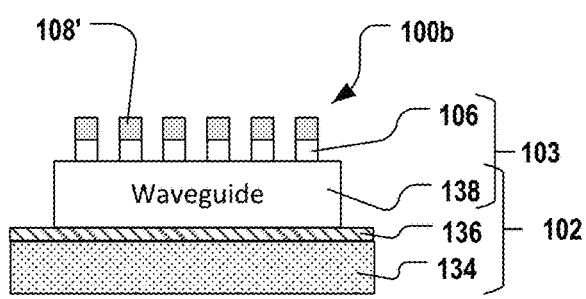
FIG. 9C is a schematic cross-sectional side view of another implementation of the device of FIG. 9A.

Referring to FIG. 9C, if the waveguide 138 is formed of an appropriate metal nitride, e.g., aluminum nitride, then the top surface of the waveguide 138 can provide the lower seed layer and can be treated to form the upper seed layer 106 or the upper seed layer 106 can be formed directly on the waveguide 108, i.e., without having to deposit a separate lower seed layer.

While particular implementations have been described, other and further implementations may be devised without departing from the basic scope of this disclosure. It is contemplated that elements and features of one embodiment may be beneficially incorporated in other embodiments without further recitation. It is to be noted, however, that the drawings illustrate only exemplary embodiments. The scope of the invention is determined by the claims that follow.

What is claimed is:

1. A superconducting device, comprising:
a dielectric or semiconductive substrate;
a metal oxide or metal oxynitride seed layer on the dielectric or semiconductive substrate, the metal oxide or metal oxynitride seed layer being an oxide or oxynitride of a first metal;
a distributed Bragg reflector between the dielectric or semiconductive substrate and the metal oxide or metal oxynitride seed layer; and
a metal nitride superconductive layer disposed directly on the metal oxide or metal oxynitride seed layer, the superconductive layer being a nitride of a different second metal and patterned to form a wire.

2. A superconducting device, comprising:
a dielectric or semiconductive substrate;
a metal oxide or metal oxynitride seed layer on the dielectric or semiconductive substrate, the metal oxide or metal oxynitride seed layer being an oxide or oxynitride of a first metal;
an optical waveguide between the dielectric or semiconductive substrate and the metal oxide or metal oxynitride seed layer to receive light propagating substantially parallel to a top surface of the dielectric or semiconductive substrate; and
a metal nitride superconductive layer disposed directly on the metal oxide or metal oxynitride seed layer, the superconductive layer being a nitride of a different second metal and patterned to form a wire.

3. A superconducting device, comprising:
a dielectric or semiconductive substrate;
a metal oxide or metal oxynitride seed layer on the dielectric or semiconductive substrate, the seed layer being an oxide or oxynitride of a first metal;
a metal nitride seed layer between the metal oxide or metal oxynitride seed layer and the dielectric or semiconductive substrate, wherein the metal nitride seed layer is a nitride of the first metal; and
a metal nitride superconductive layer disposed directly on the metal oxide or metal oxynitride seed layer, the superconductive layer being a nitride of a different second metal and patterned to form a wire.

4. The device of claim 3, wherein the metal nitride seed layer has a thickness of 3-50 nm.

5. The device of claim 3, wherein the different second metal is niobium nitride, titanium nitride, or niobium titanium nitride.

6. The device of claim 5, wherein the metal nitride superconductive layer comprises δ-phase NbN.

7. A superconducting device, comprising:
a dielectric or semiconductive substrate;
a metal oxide or metal oxynitride seed layer disposed directly on the dielectric or semiconductive substrate, the metal oxide or metal oxynitride seed layer being an oxide or oxynitride of a first metal; and
a metal nitride superconductive layer disposed directly on the metal oxide or metal oxynitride seed layer, the superconductive layer being a nitride of a different second metal and patterned to form a wire.

8. The device of claim 7, wherein the metal oxide or metal oxynitride seed layer comprises aluminum nitride (AlN) or niobium nitride (NbN) and provides a higher critical temperature to the metal nitride superconductive layer than a metal nitride layer of the first metal.

9. The device of claim 7, wherein the different second metal is niobium nitride, titanium nitride, or niobium titanium nitride.

10. The device of claim 9, wherein the metal nitride superconductive layer comprises δ-phase NbN.

11. The device of claim 9, wherein the first metal is aluminum.

12. The device of claim 7, where the metal oxide or metal oxynitride seed layer has a thickness less than 2 nm.

13. The device of claim 7, wherein the metal oxide or metal oxynitride seed layer has a thickness of 3-50 nm.

14. The device of claim 7, further comprising a capping layer on the superconductive layer.

15. The device of claim 7, including only one of the metal nitride superconductive layer.

16. The device of claim 7, wherein the metal nitride superconductive layer has a thickness of 4 to 50 nm.

17. The device of claim 1, wherein the different second metal is niobium nitride, titanium nitride, or niobium titanium nitride.

18. The device of claim 17, wherein the metal nitride superconductive layer comprises δ-phase NbN.

19. The device of claim 2, wherein the different second metal is niobium nitride, titanium nitride, or niobium titanium nitride.

20. The device of claim 19, wherein the metal nitride superconductive layer comprises δ-phase NbN.

\* \* \* \* \*

UNITED STATES PATENT AND TRADEMARK OFFICE
CERTIFICATE OF CORRECTION

PATENT NO. : 12,185,643 B2
APPLICATION NO. : 18/177096
DATED : December 31, 2024
INVENTOR(S) : Zihao Yang et al.

Page 1 of 1

It is certified that error appears in the above-identified patent and that said Letters Patent is hereby corrected as shown below:

In the Claims

In Column 10, Line 42, Claim 8, delete "(AIN)" and insert -- (AlN) --.

In Column 10, Line 50, Claim 10, delete "δ-phase" and insert -- δ-phase --.

Signed and Sealed this
Twenty-fifth Day of March, 2025

Coke Morgan Stewart
*Acting Director of the United States Patent and Trademark Office*